(12) United States Patent
Miyata

(10) Patent No.: US 9,564,735 B2
(45) Date of Patent: Feb. 7, 2017

(54) METHOD FOR CONTROLLING WAVELENGTH TUNABLE LASER

(71) Applicant: Sumitomo Electric Device Innovations, Inc., Yokohama-shi (JP)

(72) Inventor: Mitsuyoshi Miyata, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/528,919

(22) Filed: Oct. 30, 2014

(65) Prior Publication Data

US 2015/0117479 A1 Apr. 30, 2015

(30) Foreign Application Priority Data

Oct. 30, 2013 (JP) ................................ 2013-226014
Jan. 29, 2014 (JP) ................................ 2014-014781

(51) Int. Cl.
| | |
|---|---|
| *H01S 5/0687* | (2006.01) |
| *H01S 5/06* | (2006.01) |
| *H01S 5/024* | (2006.01) |
| *H01S 5/026* | (2006.01) |
| *H01S 5/028* | (2006.01) |

(Continued)

(52) U.S. Cl.
CPC .......... *H01S 5/0687* (2013.01); *H01S 5/0612* (2013.01); *H01S 5/0265* (2013.01); *H01S 5/0287* (2013.01); *H01S 5/02415* (2013.01); *H01S 5/0617* (2013.01); *H01S 5/06256* (2013.01); *H01S 5/06258* (2013.01); *H01S 5/1209* (2013.01); *H01S 5/1212* (2013.01)

(58) Field of Classification Search
CPC H01S 5/0683; H01S 5/06837; H01S 5/06256; H01S 5/06258; H01S 5/12; H01S 5/1228; H01S 5/1209
See application file for complete search history.

(56) References Cited

U.S. PATENT DOCUMENTS 6,291,813 B1 * 9/2001 Ackerman ........... H04B 10/506
250/214 R
6,400,737 B1 * 6/2002 Broutin ................ H01S 5/0687
372/20

(Continued)

FOREIGN PATENT DOCUMENTS

JP 2009-026996 A 2/2009

*Primary Examiner* — Xinning Niu
(74) *Attorney, Agent, or Firm* — Venable LLP; Michael A. Sartori; Laura G. Remus

(57) ABSTRACT

A method for controlling a wavelength tunable laser is disclosed. The method comprises the steps of: calculating a lasing wavelength from two or more kinds of parameters, the parameters designating the target lasing wavelength; acquiring a driving condition from a memory, the wavelength tunable laser being operable to generate a laser beam of a first wavelength in the driving condition; and calculating another driving condition from the driving condition thus acquired and a wavelength difference between the first wavelength and a second wavelength, the second wavelength corresponding to the lasing wavelength, the wavelength tunable laser being operable to generate a laser beam of the second wavelength in the another driving condition, the wavelength tunable laser being driven in the another driving condition.

8 Claims, 13 Drawing Sheets

(51) Int. Cl.
*H01S 5/0625* (2006.01)
*H01S 5/12* (2006.01)

(56) References Cited

U.S. PATENT DOCUMENTS

2005/0030986 A1* 2/2005 Farrell ................ H01S 5/06256
 372/32
2011/0243576 A1* 10/2011 Oomori ............ H04B 10/07955
 398/208

* cited by examiner

Fig.3

| Ch | DEFAULT VALUES ||||||| FEEDBACK-CONTROL TARGET VALUES ||
|---|---|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $I_{m1}$ [μA] | $I_{m2}/I_{m1}$ A.U. |
| 1 | 150.00 | 67.39 | 52.508 | 50.000 | 29.42 | 57.47 | 50.69 | 315.0 | 1.175 |
| 2 | 150.00 | 47.74 | 34.533 | 50.000 | 64.38 | 81.31 | 72.45 | 317.5 | 1.518 |
| 3 | 150.00 | 50.86 | 38.727 | 50.000 | 59.05 | 77.71 | 69.12 | 313.0 | 1.229 |
| ... | ... | ... | ... | ... | ... | ... | ... | ... | ... |
| n | 150.00 | 54.77 | 54.046 | 50.000 | 41.24 | 43.32 | 11.69 | 317.2 | 1.441 |

Fig.4

| TEMPERATURE CORRECTION COEFFICIENT |
|---|
| C1 [GHz/°C] |
| 0.7 |

*Fig.9*

| WAVELENGTH REQUEST | |
|---|---|
| REFERENCE FREQUENCY FTF | 191.0000THz |
| GRID INTERVAL Grid | 0.0001THz |
| CHANNEL NUMBER CH | 71 |

Fig.10

| $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $I_{m1}$ [μA] | $I_{m2}/I_{m1}$ A. U. |
|---|---|---|---|---|---|---|---|---|
| 150.00 | 67.39 | 52.508 | 50.000 | 29.42 | 57.47 | 50.69 | 315.0 | 1.175 |

*Fig.12*

| WAVELENGTH REQUEST | |
|---|---|
| REQUIRED WAVELENGTH (Freq) | 191.0070THz |

METHOD FOR CONTROLLING WAVELENGTH TUNABLE LASER

BACKGROUND OF THE INVENTION

Field of the Invention

The present invention relates to a method for controlling a wavelength tunable laser.

Related Background Art

Japanese Patent Application Publication No, 2009-026996 discloses a wavelength tunable laser capable of selecting a wavelength of an output beam. The technology disclosed in Japanese Patent Application Publication No. 2009-026996 is to store control conditions for obtaining respective grid wavelengths (referred to as "ITU-T grid wavelengths"), which are defined by the International Telecommunication Union Telecommunication Standardization Sector (ITU-T), in the memory; and to control lasing thereof at any of the ITU-T grid wavelengths based on the stored control conditions.

SUMMARY OF THE INVENTION

In gridless control which realizes a lasing at a wavelength which is not located on the ITU-T wavelength grid, lasing is required at a desired wavelength off the ITU-T grid wavelengths. Unfortunately, the technique disclosed in Japanese Patent Application Publication No. 2009-026996 cannot provide a lasing at such a desired wavelength.

It is an object of the one aspect of the present invention aims to provide a method for controlling a wavelength tunable laser to generate a laser beam at a desired wavelength.

A method for controlling a wavelength tunable laser according to one aspect of the present invention comprises the steps of: receiving two or more parameters to designate a target wavelength of the laser; calculating the target wavelength from the parameters; acquiring a driving condition of a first wavelength from a memory, the first wavelength being different from the target wavelength; calculating an another driving condition from the driving condition acquired form the memory and a wavelength difference between the first wavelength and a second wavelength, the second wavelength being denoted by the target wavelength; and driving the laser under the another driving condition.

A method for controlling a wavelength tunable laser according to another aspect of the present invention comprises the steps of: determining a target wavelength to lase the laser, the target wavelength acquired by entering an actual value of the target value or calculating the target value from two or more parameters to designate the target wavelength; acquiring a driving condition of a first wavelength from a memory, the first wavelength being different from the target wavelength; calculating an another driving condition from the driving condition acquired form the memory and a wavelength difference between the first wavelength and a second wavelength, the second wavelength being denoted by the target wavelength; and driving the laser under the another driving condition.

BRIEF DESCRIPTION OF THE DRAWINGS

FIG. 3 is a diagram showing the table containing default values and feedback control target values.

FIG. 4 is a diagram showing a stored temperature correction coefficient C1.

FIG. 9 is a diagram showing the table containing stored values for designating information.

FIG. 10 is a diagram showing the table containing updated values.

FIG. 12 is a diagram showing the table containing a stored actual value.

DESCRIPTION OF EMBODIMENTS

Figure 1:
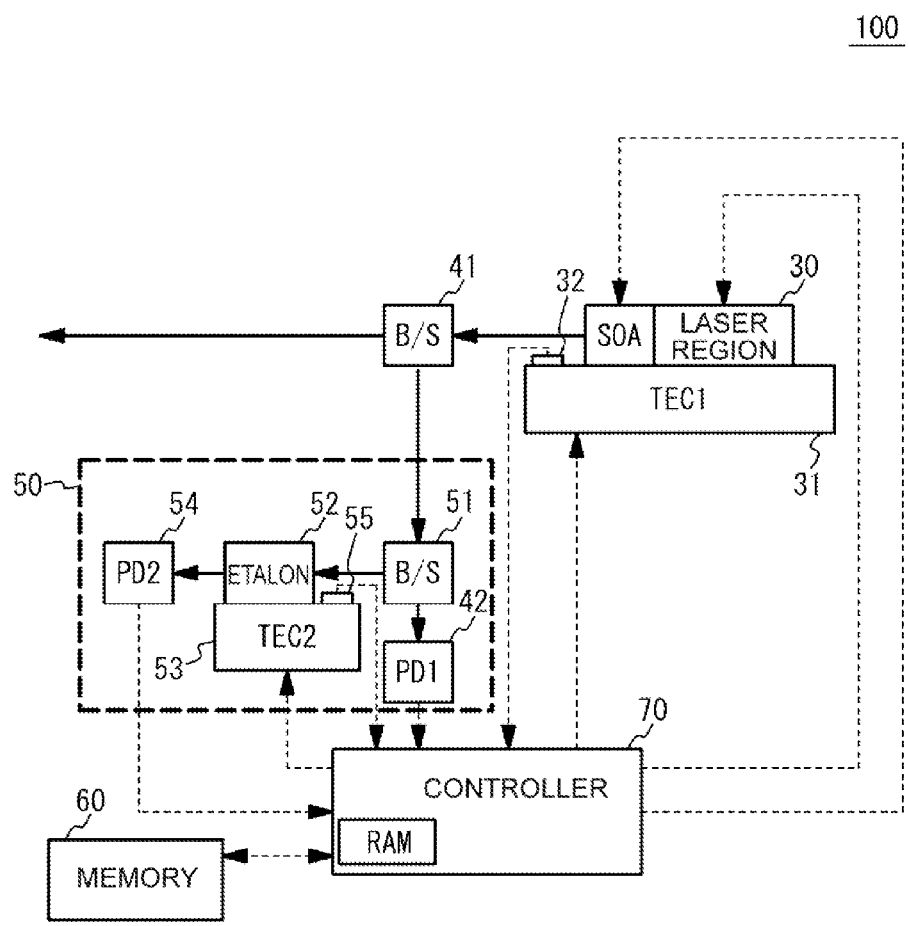
FIG. 1 is a block diagram showing the entire configuration of a wavelength tunable laser according to Embodiment 1.

First, specific examples according to an embodiment will be described below.

A method for controlling a wavelength tunable laser comprises the steps of: receiving two or more parameters to designate a target wavelength of the laser; calculating the target wavelength from the parameters; acquiring a driving condition of a first wavelength from a memory, the first wavelength being different from the target wavelength; calculating an another driving condition from the driving condition acquired from the memory and a wavelength difference between the first wavelength and a second wavelength, the second wavelength being denoted by the target wavelength; and driving the laser under the another driving condition. In the method, the two or more types of parameters include at least two of a parameter indicating a reference frequency, a parameter indicating a grid interval, and a parameter indicating a channel number. In the method, the first wavelength is any of ITU-T grid wavelengths, and the second wavelength is different from any of the ITU-T grid wavelengths. In the method, the target wavelength is calculated using the following formula (1): $F=FCF+(CH-1)\times Grid$ (1), where FCF: reference frequency, Grid: grid interval, and CH: channel number. In the method, the another driving condition of the second wavelength is calculated using the following Formula (2): $Tetln\_A=Tetln\_B+\Delta F/C1$ (2), where $Tetln\_A$: the setting temperature of the etalon for realizing the control of the required wavelength, $Tetln\_B$: the temperature of the etalon corresponding to a selected fundamental wavelength, C1: temperature correction coefficient, and $\Delta F$: the wavelength difference between the fundamental wavelength and the required wavelength.

A method for controlling a wavelength tunable laser comprises the steps of: determining a target wavelength to lase the laser, the target wavelength acquired by entering an actual value of the target value or calculating the target value from two or more parameters to designating the target wavelength; acquiring a driving condition of a first wavelength from a memory, the first wavelength being different from the target wavelength; calculating an another driving condition from the driving condition acquired from the memory and a wavelength difference between the first wavelength and a second wavelength, the second wavelength being denoted by the target wavelength; and driving the laser under the another driving condition. In the method, the two or more types of parameters include at least two of a parameter indicating a reference frequency, a parameter indicating a grid interval, and a parameter indicating a channel number. In the method, the first wavelength is any of ITU-T grid wavelengths, and the second wavelength is different from any of the ITU-T grid wavelengths. In the method, the target wavelength is calculated using the following formula (1): F=FCF+(CH−1)×Grid (1), where FCF: reference frequency, Grid: grid interval, and CH: channel number. In the method, the another driving condition of the second wavelength is calculated using the following Formula (2): Tetln_A=Tetln_B+ΔF/C1 (2), where Tetln_A: the setting temperature of the etalon for realizing the control of the required wavelength, Tetln_B: the temperature of the etalon corresponding to a selected fundamental wavelength, C1: temperature correction coefficient, and ΔF: the wavelength difference between the fundamental wavelength and the required wavelength.

A method for controlling a wavelength tunable laser comprises: a first step of calculating an lasing wavelength using two or more types of parameters, the parameters of the two or more types designating the lasing wavelength; a second step of acquiring a driving condition from a memory, the wavelength tunable laser being operable to generate a laser beam of a first wavelength in the driving condition; and a third step of calculating another driving condition in reference to the driving condition acquired in the second step and a wavelength difference between the first wavelength and a second wavelength, the second wavelength corresponding to the lasing wavelength calculated in the first step, the wavelength tunable laser being operable to generate a laser beam of the second wavelength in the other condition. The wavelength tunable laser is driven based on the driving condition calculated in the third step. The above steps can realize lasing at a required wavelength.

The two or more types of parameters may include at least two parameters including a reference frequency, a grid interval, and a channel number. The first wavelength may be any of ITU-T grid wavelengths, and the second wavelength may be different from any of the ITU-T grid wavelengths. Another method for controlling a wavelength tunable laser comprises: a first step of selecting either calculating an lasing wavelength from at least two or more types of inputted parameters designating the lasing wavelength or using an inputted actual value corresponding to the lasing wavelength; a second step of acquiring a driving condition from a memory, the wavelength tunable laser being operable to cause lasing at a first wavelength in the driving condition; and a third step of calculating another driving condition using the driving condition acquired in the second step and a wavelength difference between the first wavelength and a second wavelength, the second wavelength being the lasing wavelength selected in the first step, the wavelength tunable laser being operable to cause lasing at the second wavelength in the other driving condition, wherein the wavelength tunable laser is driven based on the driving condition calculated in the third step. Such a configuration can realize the required wavelength.

Specific examples of the method for controlling a wavelength tunable laser according to the embodiments of the present invention are described hereinafter with reference to the drawings. It should be noted that the present invention is not limited to these embodiments and is intended by the appended claims to cover all such meanings equivalent to the claims and changes made within the scope thereof.

FIG. 1 is a block diagram showing the entire configuration of a wavelength tunable laser 100 according to Embodiment 1. As shown in FIG. 1, the wavelength tunable laser 100 includes a semiconductor laser 30 (tunable semiconductor laser) as a laser device that is capable of controlling the wavelength thereof, The semiconductor laser 30 of the present embodiment is provided with a region that is coupled to a laser region and forms a semiconductor optical amplifier (SOA). This SOA functions as an optical output controller. The SOA can increase or reduce the intensity of an optical output to any levels. The SOA can also control the intensity of an optical output to practically zero. The wavelength tunable laser 100 also has a detector 50, a memory 60, a controller 70 and the like. The detector 50 functions as an output detector and a wavelength locker. The controller 70 controls the wavelength tunable laser 100 and includes a random access memory (RAM).

Figure 2:
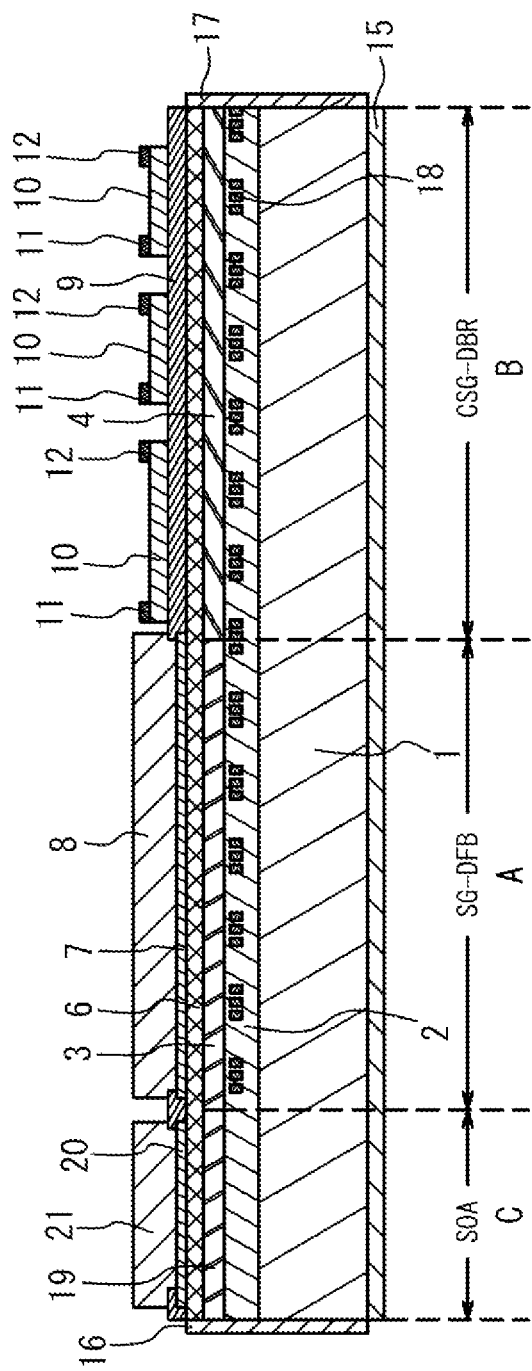
FIG. 2 is a schematic cross-sectional view showing the entire configuration of a semiconductor laser according to the embodiment.

FIG. 2 is a schematic cross-sectional view showing the entire configuration of the semiconductor laser 30 according to the present embodiment. As shown in FIG. 2, the semiconductor laser 30 has a sampled grating distributed feedback (referred to as "SG-DFB") region A, a chirped sampled grating distributed bragg reflector (referred to as "CSG-DBR") region B, and a semiconductor optical amplifier (SOA) region C. In other words, the semiconductor laser 30 has a wavelength-selecting mirror in its semiconductor structure.

For example, the SOA region C, the SG-DFB region A, and the CSG-DBR region B are arranged in this order in the direction from the front side of the semiconductor laser 30 to the rear side. The SG-DFB region A has a sampled grating with an optical gain. The CSG-DBR region B has a sampled grating without an optical gain. The SG-DFB region A and the CSG-DBR region B correspond to the laser region shown in FIG. 1, and the SOA region C corresponds to the SOA region shown in FIG. 2.

The SG-DFB region A has a structure which includes a lower cladding layer 2, an active layer 3, an upper cladding layer 6, a contact layer 7, and an electrode 8 which are stacked on a substrate 1. The CSG-DBR region B has a structure which includes the lower cladding layer 2, an optical waveguide layer 4, the upper cladding layer 6, an insulating film 9, and a plurality of heaters 10, which are stacked on the substrate 1. Each of the heaters 10 is provided with a power supply electrode 11 and a ground electrode 12. The SOA region C has a structure which includes the lower cladding layer 2, an optical amplification layer 19, the upper cladding layer 6, a contact layer 20, and an electrode 21, which are stacked on the substrate 1.

The substrate 1, the lower cladding layer 2, and the upper clear layer 6 are formed integrally across the SG-DFB region A, the CSG-DBR region B, and the SOA region C. The active layer 3, the optical waveguide layer 4, and the optical amplification layer 19 are arranged in plane with an plane. The boundary between the SG-DFB region A and the CSG-DBR region B is located at the boundary between the active layer 3 and the optical waveguide layer 4.

An end film 16 is formed on the end faces of the substrate 1, the lower cladding layer 2, the optical amplification layer 19, and the upper cladding layer 6, which are in the SOC region C. In the present embodiment, the end film 16 can constitute an antireflection (AR) film. The end film 16 provides a front-side end face of the semiconductor laser 30. An end film 17 is formed on the end faces of the substrate 1, the lower cladding layer 2, the optical waveguide layer 4, and the upper cladding layer 6, which are in the CSG-DBR region B. In the present embodiment, the end film 17 can be an AR film. The end film 17 provides a rear-side end face of the semiconductor laser 30.

The substrate 1 is, for example, a crystal substrate made of n-type InP. The lower cladding layer 2 and the upper cladding layer 6 are made of, for example, n-type InP and p-type InP, respectively. The lower cladding layer 2 and the upper cladding layer 6 sandwich the active layer 3, the optical waveguide layer 4, and the optical amplification layer 19 to confine light into these layers.

The active layer 3 is made of a semiconductor capable of optical gain. The active layer 3 has, for example, a quantum well structure including one or more well layers made of, for example, $Ga_{0.32}In_{0.68}As_{0.92}P_{0.08}$ (5 nm in thickness) and barrier layers made of $Ga_{0.22}In_{0.78}As_{0.47}P_{0.53}$ (10 nm thickness), which are alternately stacked. The optical waveguide layer 4 can be made of, for example, a bulk semiconductor layer, such as $Ga_{0.22}In_{0.78}As_{0.47}P_{0.53}$. In the present embodiment, the optical waveguide layer 4 has an energy gap greater than that of the active layer 3.

The optical amplification layer 19 is in a region that generates an optical gain in response to injection of current from the electrode 21, and accomplishes optical amplification thereby. The optical amplification layer 19 may have, for example, a quantum well structure in which one or more well layers made of, for example, $Ga_{0.35}In_{0.65}As_{0.99}P_{0.01}$ (5 nm in thickness) and barrier layers made of $Ga_{0.15}In_{0.85}As_{0.32}P_{0.65}$ (10 nm thickness) are alternately stacked. A bulk semiconductor made of, for example, $Ga_{0.44}In_{0.56}As_{0.95}P_{0.05}$ can be employed as another structure for optical amplification layer 19. Note that the optical amplification layer 19 can be made of the same material as the active layer 3.

The contact layers 7, 20 can be made of, for example, p-type $Ga_{0.47}In_{0.53}As$ crystal. The insulating film 9 works as a protective film made of a silicon nitride film (SiN) or silicon oxide film (SiO). The heaters 10 each includes a thin-film resistor made of, for example, titanium tungsten (TiW). The heaters 10 may be formed across boundaries between segments, adjacent to each other, in the CSG-DBR region B.

The electrodes 8, 21, the power supply electrode 11, and the ground electrode 12 are made of a material with electrical conductivity, such as gold (Au). A back electrode 15 is formed on the backside of the substrate 1. The back electrode 15 is formed across the SG-DFB region A, the CSG-DBR region B and the SOA region C.

The end film 16 and the end film 17 are each an AR film having a reflectivity of 1.0% or less, which makes the end faces thereof substantially non-reflective. These AR films can each be a dielectric film made of, for example, $MgF_2$ and TiON. The end facets of the laser are configured by the AR films in the present embodiment, and in some cases the end film 17 is configured by a reflective film of a significant reflectivity. In the device structure where the semiconductor in contact with the end film 17 shown in FIG. 2 includes a light absorbing layer, the application of significant reflectivity to the end film 17 prevents light from leaking from the end film 17 to the outside. Significant reflectivity means a reflectivity of, for example, 10% or higher. The reflectivity here means reflectivity to the inside of the semiconductor laser.

Plural diffraction gratings (corrugations) 18 are formed in the lower cladding layer 2 of the SG-DFB region A and the CSG-DBR region B and arranged at predetermined intervals. Therefore, a sampled grating is formed in the SG-DFB region A and the CSG-DBR region B. A plurality of segments is provided in the lower cladding layer 2 in the SG-DFB region A and the CSG-DBR region B. Each of the segments is a region having a single grating portion with a diffraction grating 18 and a single spacing portion without a diffraction grating 18 which are connected to each other. In other words, the plurality of segments is arranged to form a region in which the spacing portions and the grating portions are alternately arranged such that the single spacing portion in each segment is between the grating portions. The diffraction gratings 18 are made of a material that has a refractive index different from the material of the lower cladding layer 2. When the lower cladding layer 2 is made of InP, the diffraction gratings 18 can be made of, for example, $Ga_{0.22}In_{0.78}As_{0.47}P_{0.53}$.

Patterning for the diffraction gratings 18 can be carried out in a patterning step with use of a two-beam interference exposure method. The grating portions and the spacing portions, each of which is between the diffraction gratings 18, can be formed by two step exposure, e.g., applying a pattern for the diffraction gratings 18 to a resist by the first exposure and then by applying a pattern for area corresponding to the spacing portion to the thus exposed resist by the second exposure. The pitch of the diffraction gratings 18 in the SG-DFB region A may be the same as or different from the pitch of the diffraction gratings 18 in the CSG-DBR region B. In the present embodiment, these pitches are set at the same value. In addition, the length of the diffraction gratings 18 may be the same or different in each of the segments. The diffraction gratings 18 of the SG-DFB region A and the CSG-DBR region B may all have the same length or may have different lengths.

The segments in the SG-DFB region A have substantially the same optical length. In the CSG-DBR region B, on the other hand, at least two segments have different optical lengths. Accordingly, the peak intensities in the wavelength characteristics of the CSG-DBR region B depend upon wavelength. The average optical length of the segments in the SG-DFB region A is different from that of the segments in the CSG-DBR region B. The segments of the SC-DFB region A and the segments of the CSG-DBR region B configure an optical cavity for the semiconductor laser 30.

Light beams reflected in the SG-DFB region A and the CSG-DBR region B interfere with each other. When carriers are injected into the active layer 3 of the SG-DFB region A, the SG-DFB region A generates a discrete gain spectrum in which the peaks, having a substantially equivalent intensity, are arranged at a predetermined wavelength interval. The CSG-DBR region B, on the other hand, generates another discrete reflection spectrum in which the peaks, having substantially different intensities, are arranged at another predetermined wavelength interval. The interval of the peak wavelengths of the wavelength characteristics in the SG-DFB region A is different from that in CSG-DBR region B. A vernier effect caused by a combination of the two wavelength characteristics provides a wavelength that satisfies the lasing condition.

As shown in FIG. 1, the semiconductor laser 30 is disposed on a first temperature control device 31. The first temperature control device 31 includes a. Peltier element and functions as a TEC (Thermoelectric Cooler). A first thermister 32 is disposed on the first temperature control device 31. The first thermister 32 detects the temperature of the first temperature control device 31. The temperature of the semiconductor laser 30 can be specified based on the temperature detected by the first thermister 32.

In the wavelength tunable laser 100, the detector 50 is disposed on the front side of the semiconductor laser 30. Because the detector 50 functions as a wavelength locker, the wavelength tunable laser 100 can be of a front locking type. The detector 50 has a first light receiving device 42, a beam splitter 51, an etalon 52, a second temperature control device 53, a second light receiving device 54, and a second thermister 55.

A beam splitter 41 is located at a position where an optical beam output from the front side of the semiconductor laser 30 branches off. The beam splitter 51 is located at a position where the optical beams from the beam splitter 41 can be split thereby, and the first light receiving device 42 is provided to receive one of the two optical beams created by the beam splitter 51. The etalon 52 is disposed at a position where the other of the two optical beams created by the beam splitter 51 is transmitted therethrough. The second light receiving device 54 is provided to receive the optical beam transmitted through the etalon 52.

The etalon 52 has an optical spectrum characterized in a periodic change in transmittance dependent upon the wavelength of incident light. In the present embodiment, solid etalon is used as the etalon 52. The periodical wavelength characteristics of the solid etalon change depending upon temperature change. The etalon 52 is disposed at a position where the other of the two optical beams created by the beam splitter 51 is transmitted therethrough. The etalon 52 is disposed on the second temperature control device 53. The second temperature control device 53 includes a Peltier element and functions as a thermoelectric cooler (TEC).

The second light receiving device 54 is provided to receive the light transmitted through the etalon 52. The second thermister 55 is used in order to specify the temperature of the etalon 52. The second thermister 55 is disposed on, for example, the second temperature control device 53. In the present embodiment, the temperature of the second temperature control device 53 is detected by the second thermister 55, thereby specifying the temperature of the etalon 52.

The memory 60 may be a rewritable storage device. Examples of the rewritable storage device may include a typical flash memory. The controller 70 has a central processing unit (CPU), a random access memory (RAM), a power supply, and the like. The RAM may be a memory for temporarily storing a program executed by the CPU, data processed by the CPU, and the like.

The memory 60 stores the default values for the components of the wavelength tunable laser 100 and feedback control target values in association with channels. Each channel is represented by the number corresponding to the lasing wavelengths of the semiconductor laser 30. In the present embodiment, the channels correspond to grid wavelengths in accordance with an International Telecommunication Union Telecommunication Standardization Sector (ITU-T). In the present embodiment, the wavelength of each of the channels is defined as the fundamental wavelength.

FIG. 3 is a diagram showing the default values and the feedback control target values. As shown in FIG. 3, the default values include as follows: an initial current value $I_{LD}$ supplied to the electrode 8 of the SG-DFB region A, an initial current value $I_{SOA}$ supplied to the electrode 21 of the SOA region C; an initial temperature value $T_{LD}$ of the semiconductor laser 30; an initial temperature value $T_{Etalon}$ of the etalon 52, and initial power values $P_{Heater1}$ to $P_{Heater3}$ supplied to the heaters 10. These default values are defined for each channel. The feedback-control target values are used when the controller 70 executes feedback control. The feedback control target values include a target value $I_{m1}$ of a photoelectric current output by the first light receiving device 42, and a target value ratio $I_{m2}/I_{m1}$ between the photoelectric current $Im_1$ output by the first light receiving device 42 and a photoelectric current $I_{m2}$ output by the second light receiving device 54. The control target values also are defined for each channel. It should be noted that these values are obtained for individual wavelength tunable lasers 100 by tuning them with a wavemeter prior to shipment of the wavelength tunable lasers 100. Furthermore, a temperature correction coefficient C1 is stored in the memory 60, as shown in FIG. 4. The temperature correction coefficient C1 will be described hereinafter in detail. In the present embodiment, the temperature correction coefficient C1 can be common to all the channels.

Figure 5:
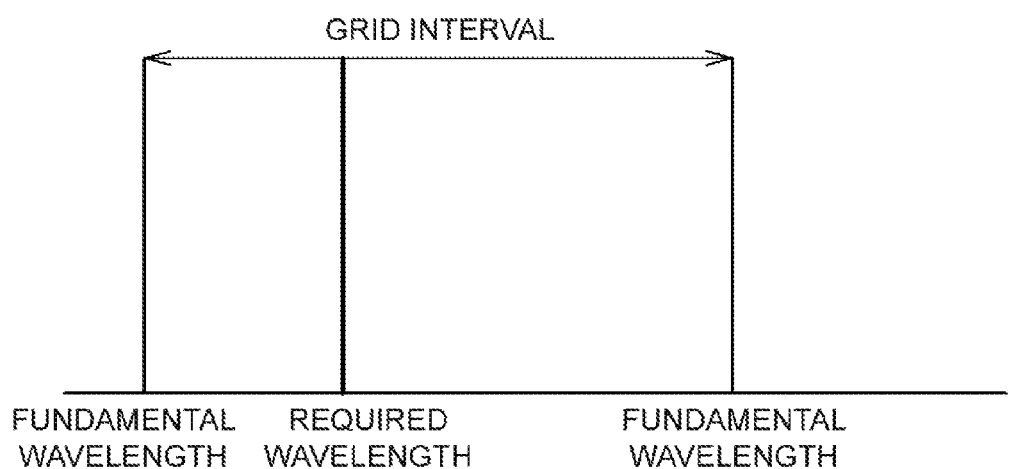
FIG. 5 is a diagram showing the relationship between a required wavelength and fundamental wavelengths for gridless control.

The wavelength tunable laser 100 according to the present embodiment can output an optical beam of a required wavelength even when the required wavelength does not match the fundamental wavelengths. A control for enabling an optical output at a wavelength different from the fundamental wavelengths is referred to as "gridless control," hereinafter. FIG. 5 is a diagram showing the relationship between the required wavelength and the fundamental wavelengths for the gridless control. In the gridless control, the required wavelength is a wavelength between a fundamental wavelength and another fundamental wavelength adjacent thereto, as shown in FIG. 5. Note that the required wavelength may the same as one of the fundamental wavelengths.

Figure 6:
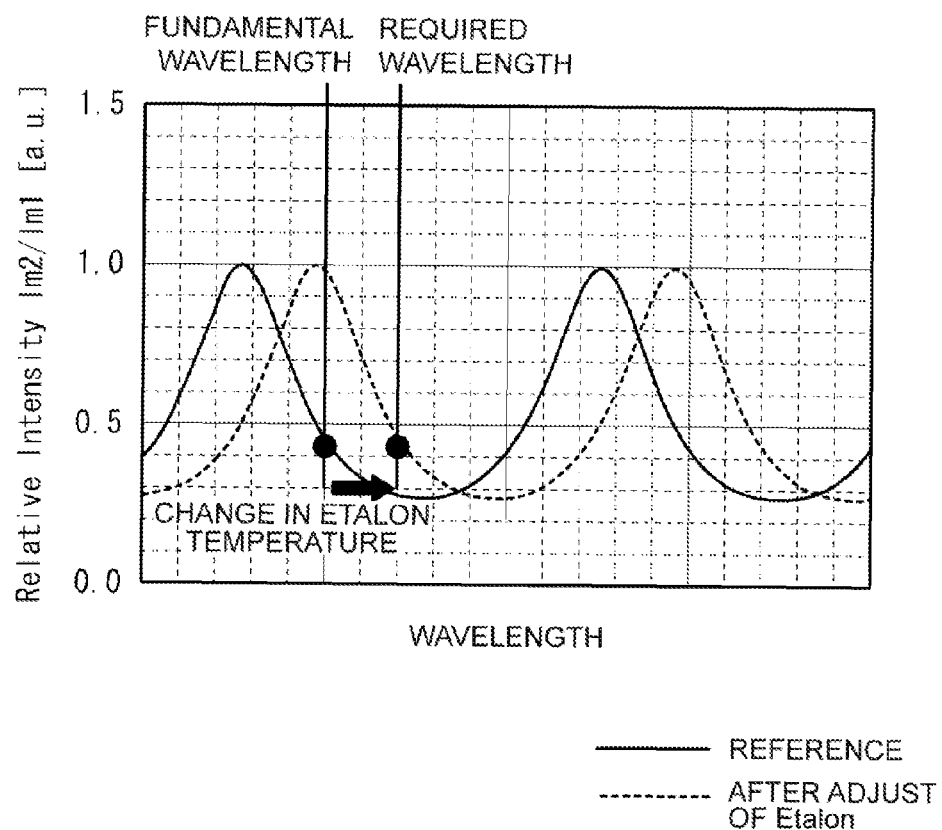
FIG. 6 is a diagram showing the principle of the gridless control.

FIG. 6 is a diagram showing the principle of the gridless control. In FIG. 6, the horizontal axis represents wavelengths and the vertical axis represents normalizing values of the ratio $I_{m2}/I_{m1}$ (the transmittance of the etalon 52). The solid line shown in FIG. 6 represents the wavelength characteristics corresponding to the initial temperature value $T_{Etalon}$ of the etalon 52. The broken line represents the wavelength characteristics of the temperature of the etalon 52 that is increased by the second temperature control device 53. In the case where the ratio $I_{m2}/I_{m1}$ shown by the black circle on the solid line is employed as a feedback-control target value, when the etalon 52 has the initial temperature value $T_{Etalon}$, the semiconductor laser 30 oscillates at a fundamental wavelength. However, in the etalon 52 that has a temperature corresponding to the wavelength characteristics shown by the broken line, the actual lasing wavelength shifts from the fundamental wavelength by the difference in the two etalon characteristics even when the ratio $I_{m2}/I_{m1}$ represents the value for lasing at the fundamental wavelength (the black circle on the dotted line). In other words, the required wavelength can be realized while keeping the ratio $I_{m2}/I_{m1}$ as the feedback-control target value, by shifting the etalon characteristics by the wavelength difference between the required wavelength and the fundamental wavelength. Specifically, computation for changing the etalon temperature can be carried out based on the wavelength difference $\Delta F$ between the required wavelength and the fundamental wavelength, and the computation result can be adopted as the etalon temperature, thereby realizing the required wavelength.

As described above, the wavelength characteristics of the etalon 52 shift depending upon the temperature of the etalon 52. The frequency variation/temperature variation [GHz/° C.] of the etalon 52 is called "temperature correction coefficient C1 of the etalon 52." Note that, in the expression, the value corresponding to the wavelengths here is replaced with the corresponding frequency. The temperature correction coefficient C1 corresponds to a rate of change versus the wavelength changes in the driving conditions for driving the wavelength tunable laser.

Suppose that the setting temperature of the etalon 52 for realizing the control of the required wavelength is represented as Tetln_A[° C.]. Also, suppose that the initial temperature of the etalon 52, i.e., the temperature of the etalon 52 corresponding to a selected fundamental wavelength, is represented as Tetln_B[° C.]. Tetln_B corresponds to $T_{Etalon}$ and is read out from the memory 60. Suppose that the wavelength difference (absolute value) between the fundamental wavelength and the required wavelength is expressed, as ΔF [GHz]. In this case, the relation between the parameters can be expressed by the Formula (1). The set temperature Tetln_A required for the lasing at the required wavelength can be calculated using the following Formula (1).

$$Tetln\_A = Tetln\_B + \Delta F/C1 \quad (1)$$

By controlling the temperature of the second temperature control device 53 to the setting temperature Tetln_A, the required wavelength can be obtained using the ratio $I_{m2}/I_{m1}$ as-is. Through the execution of the operations described above, the semiconductor laser 30 can be oscillated at the wavelength (required wavelength) that is shifted from the fundamental wavelength by the change in the characteristics of the etalon 52, as shown in FIG. 6.

Figure 7A:
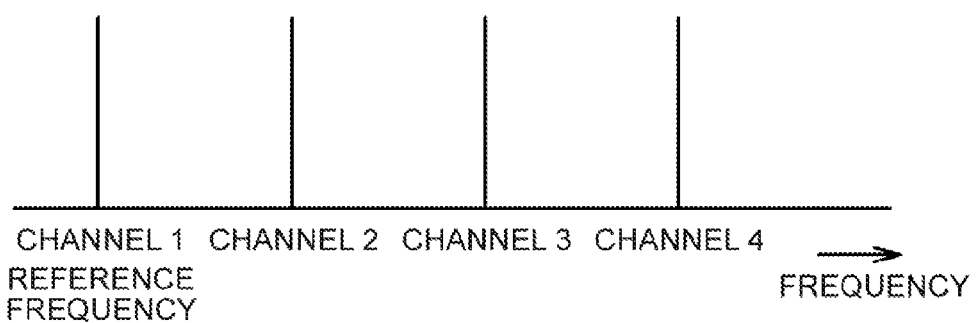
FIG. 7A is a schematic diagram showing the arrangement of frequencies corresponding to ITU-T grid wavelengths.
Figure 7B:
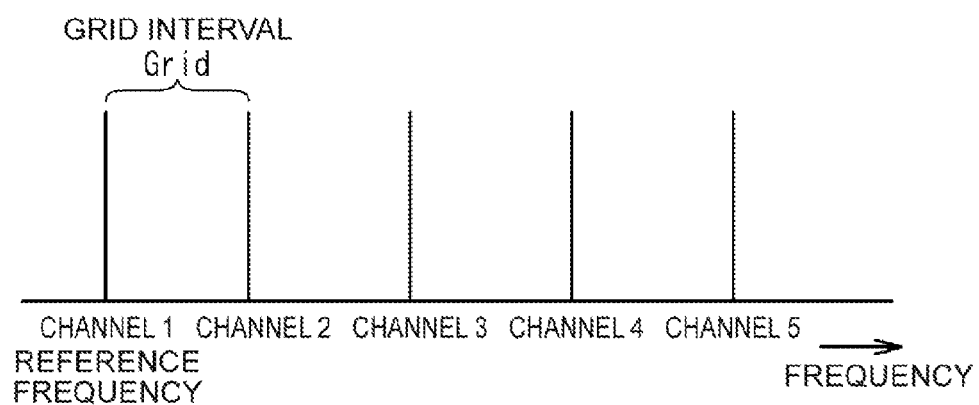
FIG. 7B is a schematic diagram showing the arrangement of frequencies corresponding to grid wavelengths different from the ITU-T grid wavelengths.

A procedure of calculating the required wavelength will be described next. A calculation procedure taken when any of grid wavelengths different from the ITU-T grid wavelengths is required is described as an example. FIG. 7A shows the table of the frequencies corresponding to the ITU-T grid wavelengths. FIG. 7B shows the table of the frequencies corresponding to the grid wavelengths different from the ITU-T grid wavelengths. The channel frequencies shown in FIG. 7B do not coincide with those shown in FIG. 7A because the grid intervals is not the same as between FIGS. 7A and 7B. For this reason, gridless control needs to be executed in order to realize the lasing at each of the grid wavelengths of FIG. 7B by using the control data shown in FIG. 3.

Indirect information data including at least two or more types of parameters is used as designating information for designating each grid wavelength. Examples of the designating information include a reference frequency, a channel number, and a grid interval. For instance, the lowest frequency among the grid wavelengths is set as a reference frequency. Suppose that the channel number of this reference frequency is defined as the channel number "1". The frequency that is shifted from this reference frequency toward the high-frequency side by the grid interval is set as a grid wavelength with channel number "2." Similarly, a channel number is also set for the highest frequency, and this reference frequency is referred to as "reference frequency first channel frequency (FCF)" hereinafter. The grid interval is referred to as "grid interval Grid" hereinafter. The channel numbers are each referred to as "channel number CH" hereinafter.

The controller 70 calculates the required wavelength from the reference frequency FCF, grid interval Grid, and channel number CH. Specifically, frequency F is obtained using the following Formula (2), and the required wavelength can be calculated from the frequency F using the following:

$$F = FCF + (CH-1) \times Grid \quad (2)$$

Figure 8:
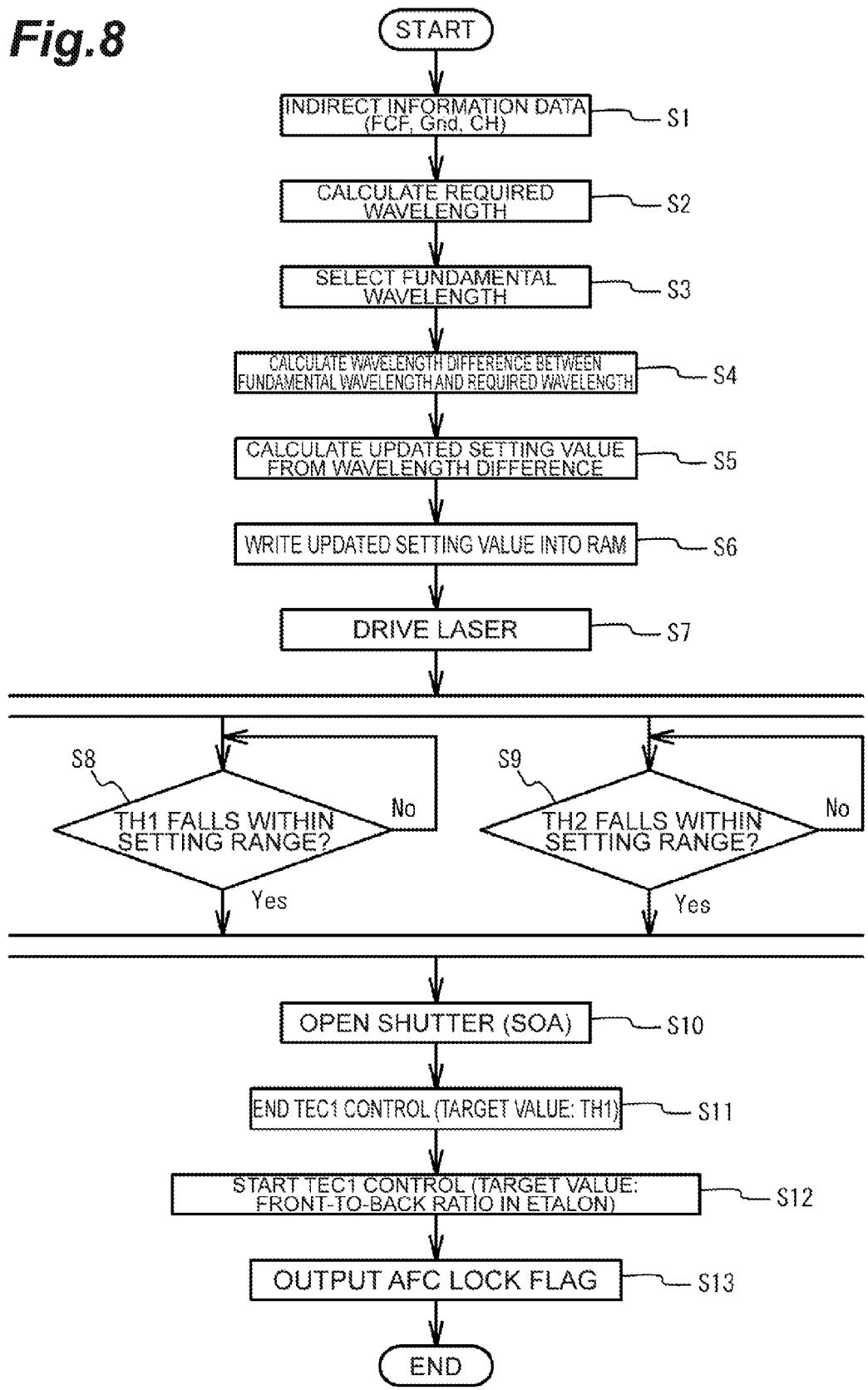
FIG. 8 is a view showing a flowchart for realizing the required wavelength in an embodiment according to the present invention.

FIG. 8 is an example of the flowchart for realizing the required wavelength. As shown in FIG. 8, the controller 70 receives the indirect information data for designating the required wavelength (step S1). The indirect information data is input from, for example, an external input/output device. Typically an input/output device with the RS232C standard interface is employed. The controller 70 also writes the indirect information data into its RAM to make a table as shown in FIG. 9. The controller 70 then calculates the required wavelength using Formula (2) described above (step S2). In the example shown in FIG. 9, the frequency F is 191.0070.

Subsequently, the controller 70 selects a fundamental wavelength based on the required wavelength (step S3). In step S3, a fundamental wavelength closest to the required wavelength may be selected. Alternatively, a fundamental wavelength that is closest to the required wavelength in the adjacent wavelength region shorter than the required wavelength may be selected. A fundamental wavelength closest to the required wavelength in the adjacent wavelength region longer than the required wavelength may be selected as well. It is not always necessary to select the fundamental wavelength closest to the required wavelength. In other words, a fundamental wavelength can be selected such that it falls within the range permitted by the performance of the wavelength control of the semiconductor laser 30.

Next, the controller 70 calculates a wavelength difference ΔF between the fundamental wavelength and the required wavelength (step S4). The controller 70 then calculates an updated setting value (step S5). The controller 70 then stores the updated setting value into the RAM as shown in FIG. 10 (step S6). The controller 70 then drives the semiconductor laser 30 using the updated setting value which has been stored in the RAM (step S7). Note that, in this procedure, the SOA region C should be controlled such that the semiconductor laser 30 does not output light to external.

Subsequently, the controller 70 determines whether a detected temperature TH1 of the first thermister 32 is within the range of $T_{LD}$ or not (step S8). The range of $T_{LD}$ is defined as a predetermined range having a temperature value $T_{LD}$ of the updated setting value at the center thereof. When the result in step S8 is determined to be "No," the controller 70 changes the current value, which is supplied to the first temperature control device 31, in such a manner that the detected temperature TH1 of the first thermister 32 changes close to the temperature value $T_{LD}$.

In parallel to step S8, the controller 70 determines whether a detected temperature TH2 of the second thermister 55 falls within a setting range or not (step S9). This setting range here is defined based on the setting temperature Tetln_A included in the updated setting values. For example, the setting range can be a predetermined range having the set temperature Tetln_A at the center thereof. When the result in step S9 is determined to be "No," the controller 70 changes the current value, which is supplied to the second temperature control device 53, in such a manner that the detected temperature TH2 of the second thermister 55 changes close to the setting temperature Tetln_A.

The controller 70 waits until the results in steps S8 and S9 are changed to "Yes." When the results in steps S8 and S9 are determined to be "Yes," the controller 70 executes a shutter open operation (step S10). Specifically, the current supplied to the electrode 21 of the SOA region C is set to the initial current value $I_{SOA}$. As a result, the semiconductor laser 30 outputs a laser beam of an updated wavelength determined based on the corresponding updated setting value.

Next, the controller 70 ends the temperature control (step S11), executed by the first temperature control device 31, which uses the temperature value $T_{LD}$ as the control target value. The controller 70 then starts AFC control by means of the first temperature control device 31 (step S12). In other words, the controller 70 executes feedback control so that the temperature of the first temperature control device 31 satisfies the ratio $I_{m2}/I_{m1}$ of a feedback control target value. The ratio between the input light power and output light power of the etalon 52 (front-to-back ratio) indicates the lasing wavelengths of the semiconductor laser 30. Furthermore, the first temperature control device 31 generates a parameter for controlling the wavelengths of the semiconductor laser 30. In other words, in step S12, the wavelength of the semiconductor laser 30 are controlled by executing feedback control of the temperature of the first temperature control device 31 such that the front-to-back ratio becomes $I_{m2}/I_{m1}$, resulting in that the required wavelength can be realized. Once the controller 70 confirms that the ratio $I_{m2}/I_{m1}$ is fallen within the predetermined range having the target value $Im_2/I_{m1}$ at the center thereof in the fundamental wavelength that is selected in step S2, the controller 70 outputs an AFC lock flag (step S13). Subsequently, the flowchart ends.

The present embodiment can be achieve the lasing at the required wavelength, when the indirect information data including at least two or more types of parameters indicates a wavelength different from the wavelengths of the channels stored in the memory 60. Therefore, the wavelength tunable laser 100 can be used as a device for realizing a wavelength on the grid having an interval different from that of the channels stored in the memory 60. The wavelength tunable laser 100 can also be used as a device that realizes any lasing wavelength different from the channels stored in the memory 60.

In some cases the indirect information data is entered as the required wavelength, while there are some cases where an actual value is entered as the required wavelength or required frequency. The present embodiment describes the wavelength tunable laser that is capable of realizing the required wavelength regardless of the above kind of input information data. The configuration of the device may be same as that described in Embodiment 1.

Figure 11:
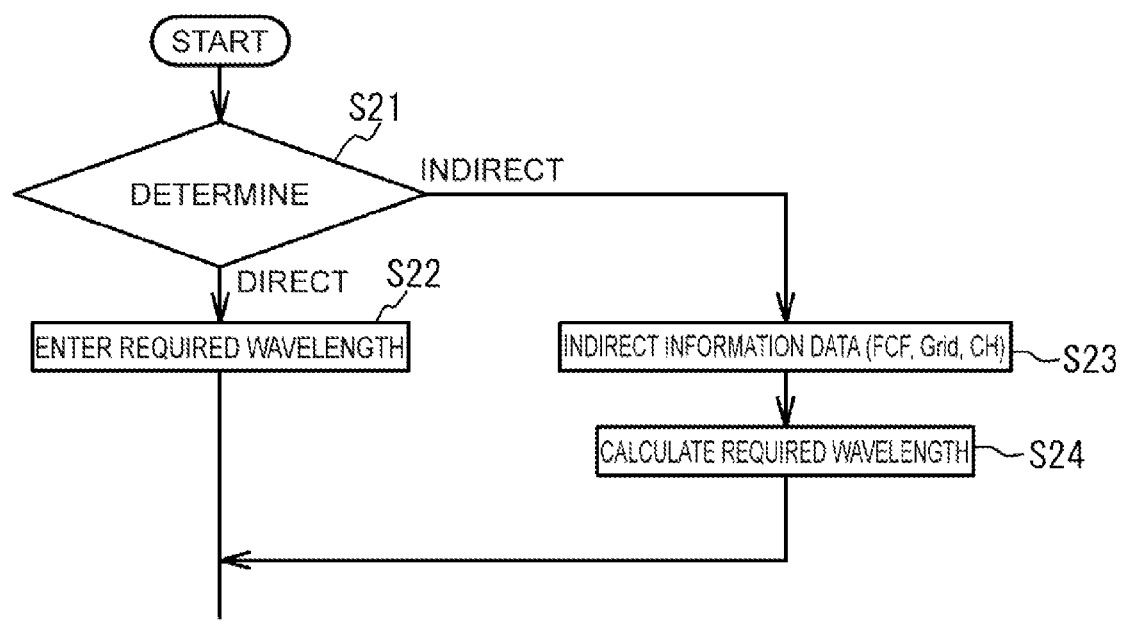
FIG. 11 is a view showing the flowchart for realizing the required wavelength in an embodiment.

FIG. 11 is an example of the flowchart for realizing the required wavelength. As shown in FIG. 11, the controller 70 determines whether the actual value of the required wavelength is directly input or the indirect information data is input (step S21). Note that the actual value of the required wavelength and the actual value of the required frequency are used as the terms of the same meaning. Step S21 determines, in advance, which one of the following settings is preferentially employed: "the actual value of the required wavelength is directly input"; or "the indirect information data of the required wavelength is input," Specifically, in the controller 70 that is configured to preferentially employ the setting of "the actual value of the required wavelength is directly input," when the controller 70 responses preferentially to the input of the actual value of the required wavelength among both the actual value of the required wavelength and the indirect information data of the required wavelength that are entered. Also, the actual value of the required wavelength is employed when the actual value of the required wavelength alone is entered. On the other hand, when the indirect information data of the required wavelength alone is entered, the indirect information data of the required wavelength is employed. When the actual value of the required wavelength is employed in step S21, the controller 70 stores the actual value into the RAM thereof to make a table as shown in FIG. 12 (step S22).

When the indirect information data of the required wavelength is employed in step S21, the controller 70 receives the indirect information data of the required wavelength (step S23). The indirect information data is entered through, for example, an external input/output device. Typically, an input/output device with the RS232C standard interface is employed. The controller 70 also stores the indirect information data into the RAM thereof to make a table as shown in FIG. 9. Next, the controller 70 calculates the required wavelength using above-described Formula (2) (step S24). In the example shown in FIG. 9, the frequency F is 191.0070. After the execution of step S22 or S24 is executed, steps S3 to S13 shown in FIG. 8 are executed. Thereafter, the flowchart is ended.

According to the present embodiment, even in the case where a lasing wavelength different from the channels stored in the memory 60 is required in the form of the indirect information data or actual value, the required wavelength can be realized. Therefore, the wavelength tunable laser 100 can be used as a device that realizes a lasing wavelength on the grid with an interval different from that of the channels stored in the memory 60. The wavelength tunable laser 100 can also be used as a device that realizes any wavelength different from the wavelengths of the channels stored in the memory 60.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method for controlling a wavelength tunable laser, comprising the steps of:
   receiving two or more parameters to designate a target wavelength of the laser;
   calculating the target wavelength from the parameters;
   acquiring a driving condition of a first wavelength from a memory, the first wavelength being different from the target wavelength;
   calculating an another driving condition from the driving condition acquired from the memory and a wavelength difference between the first wavelength and a second wavelength, the second wavelength being denoted by the target wavelength; and
   driving the laser under the another driving condition,
   wherein the first wavelength is any of ITU-T grid wavelengths, and the second wavelength is different from any of the ITU-T grid wavelengths.

2. The method according to claim 1, wherein the two or more types of parameters include at least two of a parameter indicating a reference frequency, a parameter indicating a grid interval, and a parameter indicating a channel number.

3. A method for controlling a wavelength tunable laser, comprising the steps of:
   determining a target wavelength to lase the laser, the target wavelength acquired by entering an actual value of the target value or calculating the target value from two or more parameters to designate the target wavelength;
   acquiring a driving condition of a first wavelength from a memory, the first wavelength being different from the target wavelength;
   calculating an another driving condition from the driving condition acquired from the memory and a wavelength difference between the first wavelength and a second wavelength, the second wavelength being denoted by the target wavelength; and driving the laser under the another driving condition, wherein the first wavelength is any of ITU-T grid wavelengths, and the second wavelength is different from any of the ITU-T grid wavelengths.

4. The method according to claim 3, wherein the two or more types of parameters include at least two of a parameter indicating a reference frequency, a parameter indicating a grid interval, and a parameter indicating a channel number.

5. The method according to claim 1, wherein the target wavelength is calculated using the following formula (1):

$$F = FCF + (CH-1) \times Grid \quad (1),$$

where FCF : reference frequency
Grid : grid interval, and
CH : channel number.

6. The method according to claim 3, wherein the target wavelength is calculated using the following formula (1):

$$F = FCF + (CH-1) \times Grid \quad (1),$$

where FCF : reference frequency,
Grid : grid interval, and
CH : channel number.

7. The method according to claim 1, wherein the another driving condition of the second wavelength is calculated using the following Formula (2):

$$Tetln\_A = Tetln\_B + \Delta F/C1 \quad (2),$$

where Tetln_A: the setting temperature of the etalon for realizing the control of the required wavelength,
Tetln_B: the temperature of the etalon corresponding to a selected fundamental wavelength,
C1: temperature correction coefficient, and
ΔF: the wavelength difference between the fundamental wavelength and the required wavelength.

8. The method according to claim 3, wherein the another driving condition of the second wavelength is calculated using the following Formula (2):

$$Tetln\_A = Tetln\_B + \Delta F/C1 \quad (2),$$

where Tetln_A: the setting temperature of the etalon for realizing the control of the required wavelength,
Tetln_B: the temperature of the etalon corresponding to a selected fundamental wavelength,
C1: temperature correction coefficient, and
ΔF: the wavelength difference between the fundamental wavelength and the required wavelength.

* * * * *